(12) United States Patent
Takagi (10) Patent No.: US 9,407,841 B2
(45) Date of Patent: Aug. 2, 2016

(54) DEPTH MEASUREMENT APPARATUS, IMAGING APPARATUS, AND METHOD OF CONTROLLING DEPTH MEASUREMENT APPARATUS

(71) Applicant: CANON KABUSHIKI KAISHA, Tokyo (JP)

(72) Inventor: Akinari Takagi, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 91 days.

(21) Appl. No.: 14/291,728

(22) Filed: May 30, 2014

(65) Prior Publication Data

US 2014/0362191 A1    Dec. 11, 2014

(30) Foreign Application Priority Data

Jun. 7, 2013   (JP) ................................. 2013-121177

(51) Int. Cl.
| | |
|---|---|
| H04N 13/02 | (2006.01) |
| H04N 5/357 | (2011.01) |
| H04N 5/217 | (2011.01) |
| H04N 5/228 | (2006.01) |
| H04N 5/369 | (2011.01) |
| H04N 13/00 | (2006.01) |

(52) U.S. Cl.
CPC ............. *H04N 5/357* (2013.01); *H04N 5/3696* (2013.01); *H04N 13/0228* (2013.01); *H04N 13/0271* (2013.01); *H04N 13/0217* (2013.01); *H04N 13/0232* (2013.01); *H04N 2013/0081* (2013.01)

(58) Field of Classification Search
CPC .... H04N 13/025; H04N 5/357; H04N 5/3696
USPC ................................. 348/241, 222.1, 294, 49
See application file for complete search history.

(56) References Cited

U.S. PATENT DOCUMENTS

| | | | |
|---|---|---|---|
| 7,456,886 B2 | 11/2008 | Shinohara | |
| 2012/0194721 A1* | 8/2012 | Sakaida ............. | H04N 5/23212 348/302 |
| 2013/0194387 A1* | 8/2013 | Hatakeyama ........ | H04N 5/3572 348/46 |
| 2013/0235253 A1* | 9/2013 | Onuki ................ | H04N 5/23212 348/349 |

FOREIGN PATENT DOCUMENTS

| | | |
|---|---|---|
| JP | 2001-042462 A | 2/2001 |
| JP | 2004-134867 A | 4/2004 |

OTHER PUBLICATIONS

U.S. Appl. No. 14/291,611, filed May 30, 2014.
U.S. Appl. No. 14/291,503, filed May 30, 2014.

* cited by examiner

*Primary Examiner* — Tuan Ho
*Assistant Examiner* — Chan Nguyen
(74) *Attorney, Agent, or Firm* — Fitzpatrick, Cella, Harper & Scinto (57) ABSTRACT

A depth measurement apparatus including ranging pixels each having a plurality of photoelectric conversion units for receiving light fluxes that have respectively passed through first and second pupil regions, a reading unit that is shared by the plurality of photoelectric conversion units, and a control unit for controlling the ranging operation, wherein a signal charge accumulated in one of the photoelectric conversion units is output as a first signal and a second signal obtained by adding a signal accumulated in the other photoelectric conversion unit to the first signal is output, the signal charge accumulated in the other photoelectric conversion unit is acquired based on a difference between the first and second signals, and the signal charge of the photoelectric conversion unit receiving flux with a lower transmittance is read first.

13 Claims, 7 Drawing Sheets

DEPTH MEASUREMENT APPARATUS, IMAGING APPARATUS, AND METHOD OF CONTROLLING DEPTH MEASUREMENT APPARATUS

BACKGROUND OF THE INVENTION

1. Field of the Invention

The present invention relates to a depth measurement apparatus for measuring the distance to an object, and particularly relates to a depth measurement apparatus that is used in an imaging apparatus or the like.

2. Description of the Related Art

In a digital still camera or a video camera, proposed is a solid image pickup device in which ranging pixels (depth measurement pixels) with a ranging function are arranged as a part or all of the pixels of the image pickup device, and the distance is detected based on the phase difference system (Japanese Patent Application Publication No. 2001-42462). The ranging pixels include a plurality of photoelectric conversion units. The plurality of photoelectric conversion units are disposed at positions that are substantially optically conjugate with the exit pupil of the camera lens via the microlens in the pixels. It is thereby possible to achieve a configuration where the light flux that has passed through different regions on the pupil of the camera lens can be guided to the respective photoelectric conversion units. Based on the signals obtained with the plurality of photoelectric conversion units disposed in each ranging pixel, an optical image (hereinafter referred to as the "image for ranging") that is generated from the light flux that has passed through different pupil regions is thereby acquired. The distance can be measured by calculating the de-focus amount using the principle of triangulation based on the shift amount of the two images for ranging. Moreover, an imaging signal can be obtained by totaling the outputs of the plurality of photoelectric conversion units in one pixel.

In addition, in order to speed up the process of acquiring signals, known is a method of sharing a reading unit among the plurality of photoelectric conversion units, and adding and reading the outputs of the plurality of photoelectric conversion units. For example, known is a method of sharing the reading unit between two photoelectric conversion units, transferring the output of the first photoelectric conversion unit to an amplifying element and reading the output, thereafter transferring the output of the second photoelectric conversion unit to the amplifying element, and then reading the output sum of both photoelectric conversion units (Japanese Patent Application Publication No. 2004-134867). The output of the second photoelectric conversion unit is obtained by subtracting the output of the first photoelectric conversion unit from the output sum of both photoelectric conversion units. Consequently, in comparison to the method of individually transferring the output of the respective photoelectric conversion units to the amplifying element and then reading the output, the reading operation can be performed at a high speed since the number of reset operations of the amplifying element can be reduced.

Nevertheless, with the method described in Japanese Patent Application Publication No. 2004-134867, depending on the photographing conditions, there was a problem in that there is a region where the ranging accuracy in the plane of the image pickup device will deteriorate.

Generally speaking, the exit pupil position of the camera lens changes depending on the zoom or focus condition. Meanwhile, the positional relationship of the microlens and the photoelectric conversion unit in the pixel is fixed. Thus, depending on the photographing conditions, there are cases where the photoelectric conversion unit and the exit pupil deviate from a conjugate relation. When deviating from the conjugate relation, the regions on the pupil through which passes the light flux received by the respective photoelectric conversion units of the ranging pixels will differ according to the positions of the respective ranging pixels in the image pickup device. When the area of the light flux received with the respective ranging pixels becomes small on the pupil, the brightness of the detected image for ranging will deteriorate. Thus, the light intensity of the images detected with the respective photoelectric conversion units in the ranging pixels will differ according to the positions of the respective ranging pixels in the image pickup device.

Meanwhile, when the photoelectric conversion unit output is obtained based on subtraction, the SN ratio of the output signal (image signal for ranging) is low since the generation of random noise differs in comparison to the case of independently reading the photoelectric conversion unit output.

Even though the detected light intensity differed according to the positions of the ranging pixels in the image pickup device, conventionally, the output signal of the photoelectric conversion units of the same positional relationship in the ranging pixels was constantly read independently. Thus, there are cases where the photoelectric conversion unit with low detected light intensity and the photoelectric conversion unit (photoelectric conversion unit in which the output is obtained based on subtraction), which has a low SN ratio due to the subtraction, coincide, and the SN ratio of the image signal for ranging based on the output of this photoelectric conversion unit will deteriorate considerably. When the SN ratio of the image signal for ranging deteriorates, the reading error of the image deviation will increase, and the ranging accuracy will deteriorate. Since the detected light intensity depends on the positions of the respective ranging pixels in the image pickup device, there are regions on the plane of the image pickup device with a low ranging accuracy.

Note that, even in cases where the conjugate relation of the photoelectric conversion unit and the exit pupil of the camera lens is maintained, when there is shading of the light flux, or vignetting, in the lens frame, the detected light intensity will differ depending on the positions of the ranging pixels in the image pickup device. The change in light intensity will increase and the ranging accuracy will consequently deteriorate depending on the aperture diameter of the camera lens and the foregoing photographing conditions.

SUMMARY OF THE INVENTION

In light of the foregoing problems, an object of this invention is to provide a depth measurement apparatus capable of accurately performing ranging in the entire range of the image pickup device regardless of the photographing conditions.

The first aspect of the present invention is a depth measurement apparatus, comprising: an imaging optical system; an image pickup device which includes ranging pixels each having a photoelectric conversion unit for receiving a light flux that has passed through a first pupil region of the imaging optical system and a photoelectric conversion unit for receiving a light flux that has passed through a second pupil region, that is different from the first pupil region, of the imaging optical system; a reading unit that is shared by a plurality of photoelectric conversion units in the ranging pixels; and a control unit configured to control the ranging operation, wherein the control unit is configured so that a signal charge accumulated in a first photoelectric conversion unit among the plurality of photoelectric conversion units is transferred to the reading unit, and a first signal corresponding to the signal charge accumulated in the first photoelectric conversion unit is output, the control unit is configured so that a signal charge accumulated in a second photoelectric conversion unit that is different from the first photoelectric conversion unit is transferred and added to the reading unit, and a second signal corresponding to a sum of the signal charges accumulated in the first and second photoelectric conversion units is output, the control unit is configured so that a third signal corresponding to the signal charge accumulated in the second photoelectric conversion unit is generated based on a difference between the second signal and the first signal, the control unit is configured so that a distance to an object is measured based on an image shift amount of parallax images respectively generated from the first signal and the third signal, and from among the photoelectric conversion unit for receiving the light flux that has passed through the first pupil region and the photoelectric conversion unit for receiving the light flux that has passed through the second pupil region, the photoelectric conversion unit receiving light flux with a lower transmittance in a travel path from an object to the photoelectric conversion unit is the first photoelectric conversion unit.

The second aspect of the present invention is an imaging apparatus comprising the above-described depth measurement apparatus, the imaging apparatus acquiring an object image based on the second signal.

The third aspect of the present invention is a method of controlling a depth measurement apparatus that includes: an imaging optical system; an image pickup device which includes ranging pixels each having a photoelectric conversion unit for receiving a light flux that has passed through a first pupil region of the imaging optical system and a photoelectric conversion unit for receiving a light flux that has passed through a second pupil region, that is different from the first pupil region, of the imaging optical system; and a reading unit that is shared by a plurality of photoelectric conversion units in the ranging pixels, the method comprising the steps of: determining, as the first photoelectric conversion unit, the photoelectric conversion receiving light flux with a lower transmittance in a travel path from an object to the photoelectric conversion unit, from among the photoelectric conversion unit for receiving the light flux that has passed through the first pupil region and the photoelectric conversion unit for receiving the light flux that has passed through the second pupil region; transferring a signal charge accumulated in a first photoelectric conversion unit among the plurality of photoelectric conversion units to the reading unit, and outputting a first signal corresponding to the signal charge accumulated in the first photoelectric conversion unit; transferring and adding a signal charge accumulated in a second photoelectric conversion unit that is different from the first photoelectric conversion unit to the reading unit, and outputting a second signal corresponding to a sum of the signal charges accumulated in the first and second photoelectric conversion units; generating a third signal corresponding to the signal charge accumulated in the second photoelectric conversion unit based on a difference between the second signal and the first signal; and measuring a distance to an object based on an image shift amount of parallax images respectively generated from the first signal and the third signal.

According to the present invention, accurate ranging is enabled across the entire range of the image pickup device regardless of the photographing conditions. In particular, the distance to a dark object can be measured accurately.

Further features of the present invention will become apparent from the following description of exemplary embodiments with reference to the attached drawings.

DESCRIPTION OF THE EMBODIMENTS

The depth measurement apparatus according to an embodiment of the present invention is now explained with reference to the drawings. The components having the same functions in all diagrams are given the same reference numeral, and the redundant explanation thereof is omitted.

Embodiment 1

Figure 1:
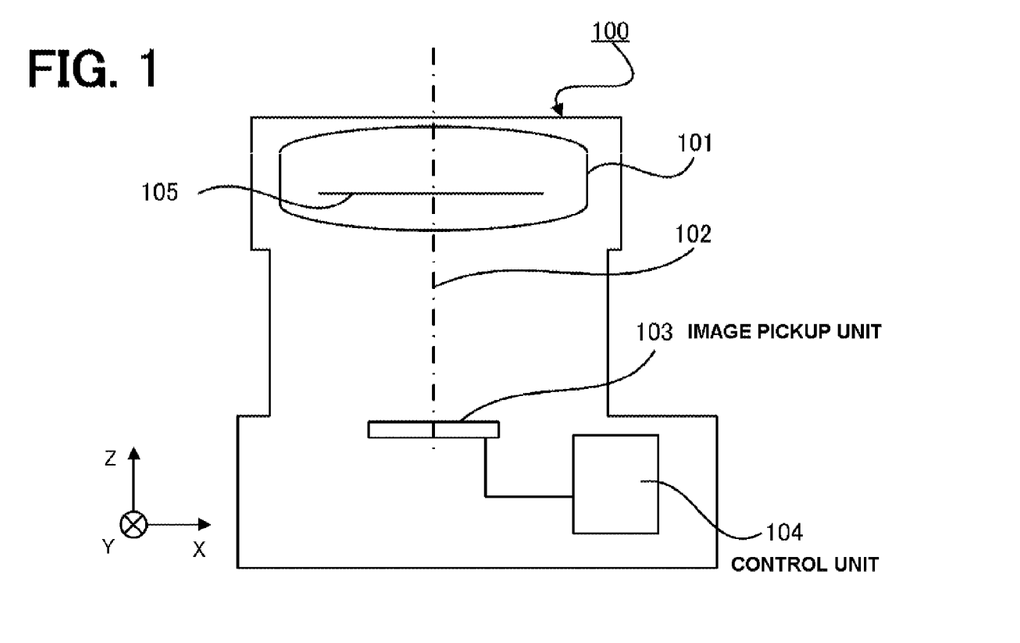
FIG. 1 is a configuration example of the camera including the depth measurement apparatus according to Embodiment 1.

A configuration example of a digital camera 100 (imaging apparatus) including the depth measurement apparatus of this embodiment is shown in FIG. 1. In FIG. 1, the digital camera 100 is configured from a taking lens 101, an image pickup device 103, and a control unit 104. The image pickup device 103 is disposed on an optical axis 102 of the taking lens 101, and the taking lens 101 forms an image of an object on the image pickup device 103. Reference numeral 105 represents an exit pupil of the taking lens 101.

Figure 2A:
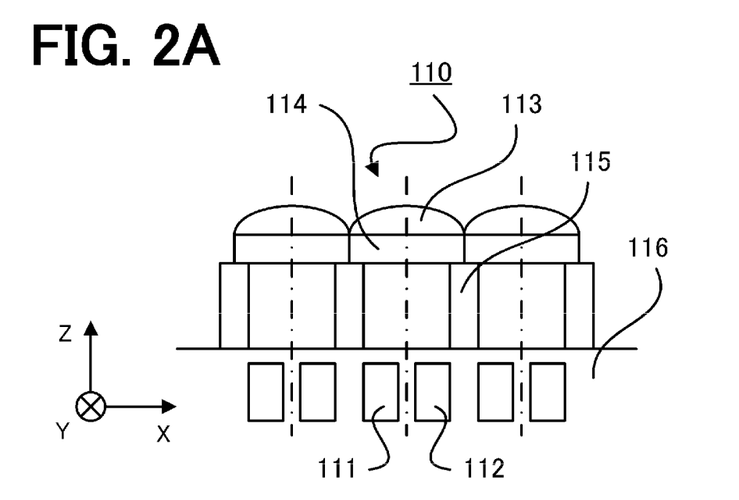
FIGS. 2A and 2B are cross sections of the relevant part of the ranging pixels included in the image pickup device.
Figure 2B:
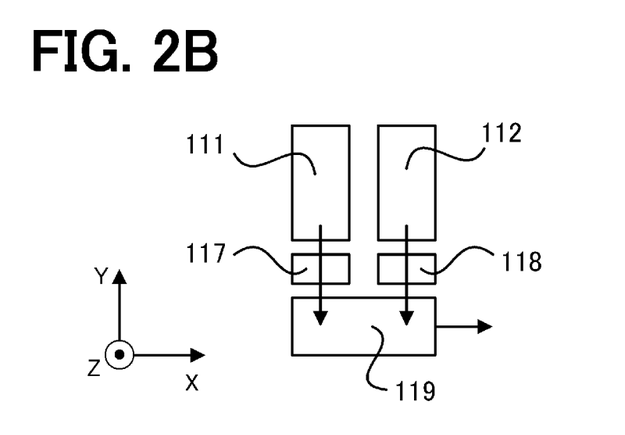

FIG. 2 is a cross section of the relevant part of a ranging pixel (depth measurement pixel) 110 included in the image pickup device (image sensor) 103. As shown in FIG. 2A, the ranging pixel 110 is configured from a microlens 113, a color filter 114, a wiring part 115, and photoelectric conversion units 111 and 112 formed in a silicon substrate 116. Light that enters from the microlens 113 passes through the color filter 114, passes through the wiring part 115 disposed between the pixels, and enters the photoelectric conversion units 111 and 112. The light that entered the photoelectric conversion units 111 and 112 is subjected to photoelectric conversion and generates a signal charge according to the intensity of the incident light. The generated signal charge is accumulated in the photoelectric conversion units 111 and 112.

As shown in FIG. 2B, the signal charge accumulated in the photoelectric conversion unit 111 is transferred to an amplifying/reading unit 119 via a gate 117 and then output. Moreover, the signal charge accumulated in the photoelectric conversion unit 112 is transferred to the amplifying/reading unit 119 via a gate 118 and then output. The amplifying/reading unit 119 can read either signal charge from the photoelectric conversion units 111 and 112. In other words, one amplifying/reading unit 119 is shared by two photoelectric conversion units 111 and 112 in one ranging pixel.

The control unit 104 is configured from an ASIC, a microprocessor, a memory and the like, and controls the ranging operation including the reading of the signal charge from the photoelectric conversion unit, for example, by the microprocessor executing the programs stored in the memory. In the ensuing explanation, the signal reading method of the control unit 104 is explained by taking a case of first outputting a signal corresponding to the signal charge accumulated in the photoelectric conversion unit 111 as an example. The control unit 104 resets the reading unit 119 and thereafter opens the gate 117, and transfers the signal charge accumulated in the photoelectric conversion unit 111 to the amplifying/reading unit 119 (reading unit). After the transfer, a signal (first signal) corresponding to the signal charge accumulated in the photoelectric conversion unit 111 is output, then stored in the memory. Subsequently, the control unit 104 subtracts the first signal from the second signal, and calculates a signal (third signal) corresponding to the signal charge accumulated in the photoelectric conversion unit 112.

Subsequently, the control unit 104 opens the gate 118, and transfers the signal charge accumulated in the photoelectric conversion unit 112 to the amplifying/reading unit 119 (reading unit). After the transfer is complete, a signal (second signal) obtained by addition of the signal charge transferred from the photoelectric conversion unit 112 is output in addition to the first signal, and then stored in the memory.

Then, the control unit 104 subtracts the first signal from the second signal to obtain a signal (third signal) corresponding to the signal charge accumulated in the photoelectric conversion unit 112. Note that, in order to eliminate the kTC noise that is generated upon resetting the amplifying/reading unit, known noise elimination operations such as correlated double sampling may also be performed. More specifically, prior to opening the gate 117, the reset level signal from the amplifying/reading unit may be output and stored, and the reset level may be subtracted from the signals that are read in the subsequent operations to attain the respective signals.

In the ensuing explanation, the photoelectric conversion unit (photoelectric conversion unit 111 in the foregoing example) from which the signal charge is to be read first is referred to as the first photoelectric conversion unit. Moreover, the photoelectric conversion unit (photoelectric conversion unit 112 in the foregoing example) from which the signal charge is to be read subsequently is referred to as the second photoelectric conversion unit.

Figure 3:
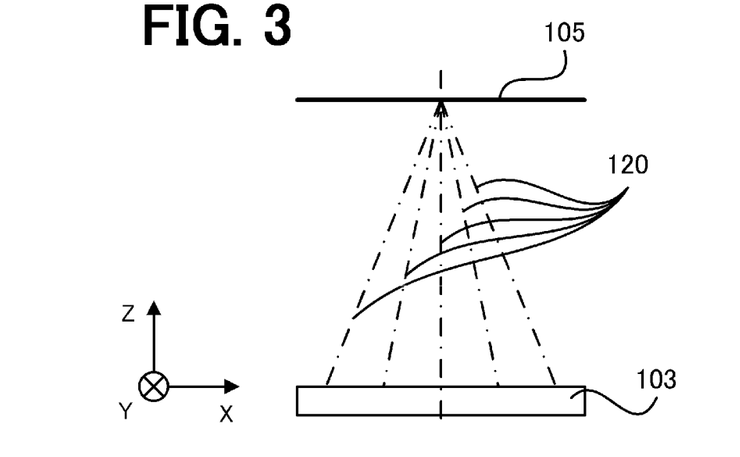
FIG. 3 is a diagram explaining the relationship of the exit pupil and the ranging pixels.

The photoelectric conversion units 111 and 112 of all ranging pixels 110 included in the image pickup device 103 are of an optical conjugate relation with the exit pupil 105 of the taking lens 101 based on the microlens 113 of the respective ranging pixels 110. Here, as shown in FIG. 3, the center point of the line segment connecting the respective center points of the photoelectric conversion unit 111 and the photoelectric conversion unit 112 optically coincides with the center point of the exit pupil 105 of the taking lens 101. In FIG. 3, the optical axes 120 are line segments that pass through the center point of the line segment connecting the respective center points of the photoelectric conversion unit 111 and the photoelectric conversion unit 112 in the respective ranging pixels 110 in the image pickup device 103, and through the center point of the microlens 113 of the respective ranging pixels 110. The optical axes 120 of the respective ranging pixels 110 all pass through the center point of the exit pupil 105.

Based on the foregoing arrangement, the photoelectric conversion unit 111 receives the light flux that has passed through the region (first pupil region) that is decentered to one side from the center point of the exit pupil 105. Moreover, the photoelectric conversion unit 112 receives the light flux that has passed through the region (second pupil region) that is decentered to a side that is opposite to the first pupil region from the center point of the exit pupil 105. The control unit 104 acquires the object image by the light flux that has passed through the first pupil region based on the output signal (first signal) of the photoelectric conversion unit 111 of the plurality of ranging pixels 110 in the image pickup device 103. Moreover, the control unit 104 acquires the object image by the light flux that has passed through the second pupil region based on the output signal (third signal) of the photoelectric conversion unit 112 of the plurality of ranging pixels 110. Since the position of the first pupil region and the position of the second pupil region are different, the two acquired object images are subject to parallax. Thus, by obtaining the displacement of the two object images, the distance to the object can be obtained by using the principle of triangulation.

Moreover, the second signal is the sum of the signal charges accumulated in the photoelectric conversion unit 111 and the photoelectric conversion unit 112. The control unit 104 acquires, based on the second signal, the object image (second image signal) based on the light flux that has passed through the pupil region as the sum of the first pupil region and the second pupil region; that is, the entire range of the exit pupil 105.

Figure 4:
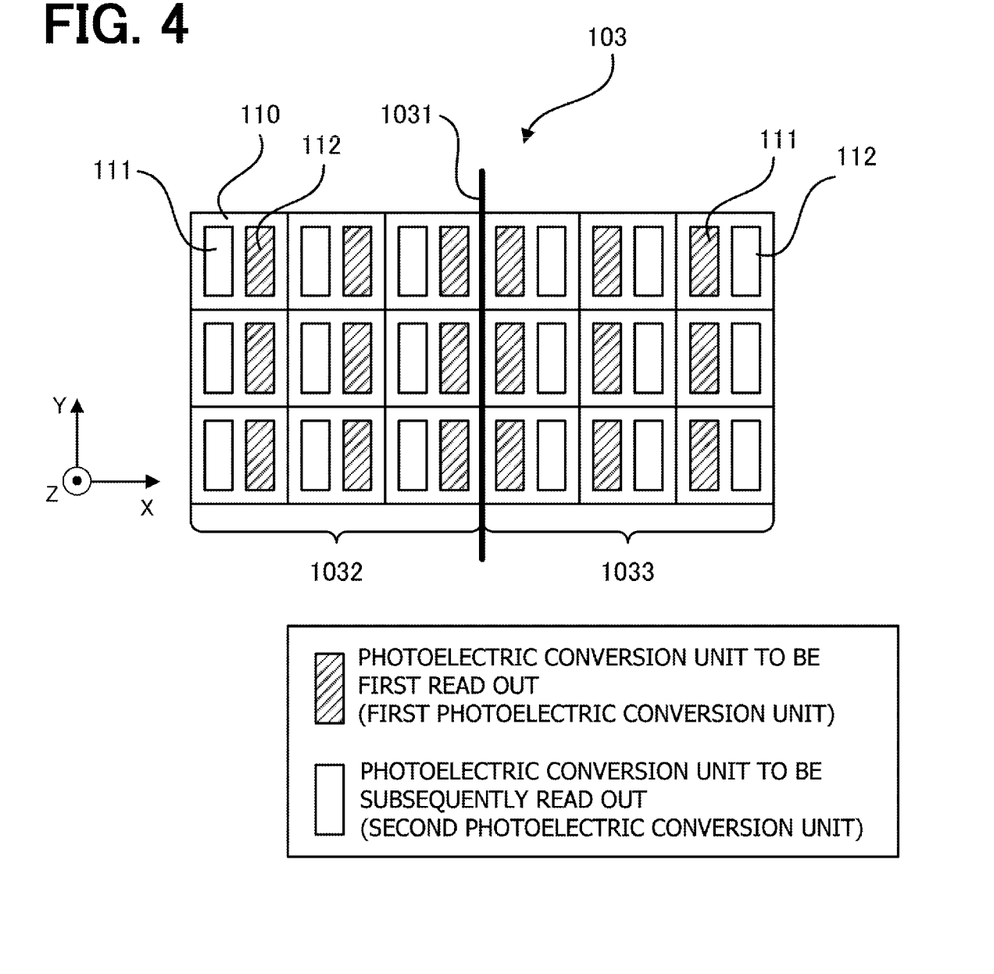
FIG. 4 is a top view of the relevant part of the image pickup device in Embodiment 1.

With the digital camera 100 according to this embodiment, the photoelectric conversion unit (first photoelectric conversion unit) to first transfer the signal charge to the reading unit 109 is caused to differ according to the position of the ranging pixels 110 in the plane of the image pickup device 103. FIG. 4 is a top view of the relevant part of the image pickup device 103. As shown in FIG. 4, the image pickup device 103 is configured by the plurality of ranging pixels 110 being arranged two-dimensionally. Each of the ranging pixels 110 is configured from the photoelectric conversion unit 111 and the photoelectric conversion unit 112. The photoelectric conversion units 111 and 112 are arranged in the same direction in all ranging pixels 110. The photoelectric conversion unit 111 is disposed on the negative direction side of the x axis in one ranging pixels 110, and the photoelectric conversion unit 112 is disposed on the positive direction side of the x axis. Note that the straight line (x axis) connecting the center points of the photoelectric conversion units 111 and 112 is parallel to the extending direction of the straight line connecting the center of gravity of the pupil region (first pupil region) through which passes the light flux received by the photoelectric conversion unit 111 and the center of gravity of the pupil region (second pupil region) through which passes the light flux received by the photoelectric conversion unit 112.

For the sake of convenience, in the ensuing explanation, the x axis positive direction in FIG. 4 is also referred to as the right direction, and the x axis negative direction is also referred to as the left direction. Accordingly, it can also be said that the photoelectric conversion unit 111 is disposed on the left side in the ranging pixels 110, and the photoelectric conversion unit 112 is disposed on the right side in the ranging pixels 110. Moreover, it can also be said that the photoelectric conversion unit 111 receives the light flux that has passed through the region (first pupil region) that is decentered to the right from the center point of the exit pupil 105, and the photoelectric conversion unit 112 receives the light flux that has passed through the region (second pupil region) that is decentered to the left from the center point of the exit pupil 105.

In FIG. 4, the shaded photoelectric conversion unit is the photoelectric conversion unit (first photoelectric conversion unit) from which the signal is first read. In this reading process, from which photoelectric conversion units 111 and 112 the signal should be read first will differ in the image pickup device region 1032 (second image pickup device region) and the image pickup device region 1033 (first image pickup device region).

The image pickup device region 1032 and the image pickup device region 1033 are disposed across a line segment 1031 as a boundary line. The line segment 1031 is a line segment that passes through the center of the image pickup device 103, and is perpendicular to the direction that connects the center point of the photoelectric conversion unit 111 and the center point of the photoelectric conversion unit 112 in one pixel. To put it differently, when the extending direction of the straight line that passes through the center of gravity of the first pupil region and the center of gravity of the second pupil region is a first direction, the line segment 1031 is a line segment that passes through the center of the image pickup device and is perpendicular to the direction on the image pickup device corresponding to the first direction.

In the image pickup device region 1032 (second image pickup device region), the signal of the photoelectric conversion unit 112 is read first in the ranging pixels 110. In other words, in the image pickup device region 1032 on the left side of the line segment 1031, the photoelectric conversion unit 112 for receiving the light flux that has passed through the pupil region (second pupil region) decentered to the left side is the first photoelectric conversion unit. In addition, the photoelectric conversion unit 111 for receiving the light flux that has passed through the pupil region (first pupil region) decentered to the right side is the second photoelectric conversion unit.

Meanwhile, in the image pickup device region 1033 (first image pickup device region), the signal of the photoelectric conversion unit 111 is read first in the ranging pixels 110. In other words, in the image pickup device region 1033 on the right side of the line segment 1031, the photoelectric conversion unit 111 for receiving the light flux that has passed through the pupil region (first pupil region) decentered to the right side is the first photoelectric conversion unit. In addition, the photoelectric conversion unit 112 for receiving the light flux that has passed through the pupil region (second pupil region) decentered to the left side is the second photoelectric conversion unit.

The reason why an image signal for ranging can be obtained with a high SN ratio according to the foregoing configuration is now explained with reference to FIG. 5.

Figure 5A:
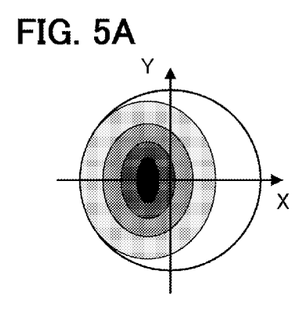
FIGS. 5A to 5I are diagrams explaining the reason why signals of a high SN ratio can be obtained in Embodiment 1.
Figure 5B:
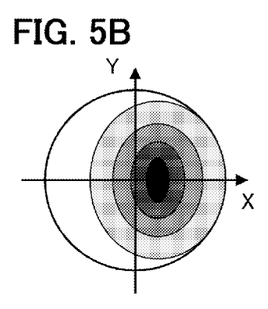
Figure 5C:
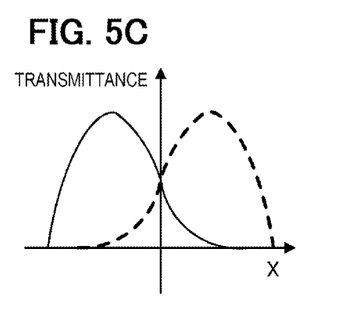

FIG. 5A represents the pupil transmittance distribution on the exit pupil 105 corresponding to the photoelectric conversion unit 112 in the ranging pixels 110 disposed near the center of the image pickup device 103, and corresponds to the left eccentric pupil region (second pupil region). In the diagram, the darker the color, the higher the transmittance, and lighter the color, the lower the transmittance. Similarly, FIG. 5B represents the pupil transmittance distribution on the exit pupil 105 corresponding to the photoelectric conversion unit 111 in the ranging pixels 110 disposed near the center of the image pickup device 103, and corresponds to the right eccentric pupil region (first pupil region). FIG. 5C represents the transmittance distribution on the x axial plane, and the horizontal axis shows the x axial coordinates and the vertical axis shows the transmittance. The solid line shows the transmittance distribution corresponding to the photoelectric conversion unit 112 (corresponding to the right eccentric pupil region), and the dotted line shows the transmittance distribution corresponding to the photoelectric conversion unit 111 (corresponding to the left eccentric pupil region). The pupil transmittance distribution is determined based on the positional relationship of the photoelectric conversion units, the microlens and the exit pupil, the aberration and diffraction of the microlens, and the light propagation status such as the light scattering and absorption in the light path from the incident surface of the image pickup device to the photoelectric conversion unit. Thus, the transmission efficiency of the light flux in a travel path from the object to the photoelectric conversion unit 111, 112 in the ranging pixels 110 will differ.

The transmission efficiency in the respective pupil regions can be obtained by integrating the transmittance distribution in the exit pupil 105 shown in FIGS. 5A and 5B. With the ranging pixels 110 disposed near the center of the image pickup device 103, the transmission efficiency of the right eccentric pupil region and the transmission efficiency of the left eccentric pupil region are substantially the same. Thus, the size of the object picture signals based on the light flux that passes through the respective pupil regions is substantially the same. Therefore, the signal charge of either photoelectric conversion units may be transferred to the reading unit first.

Figure 5D:
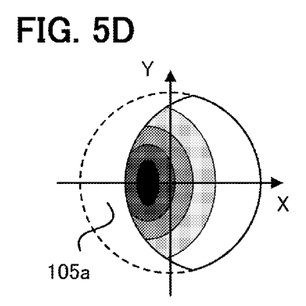
Figure 5E:
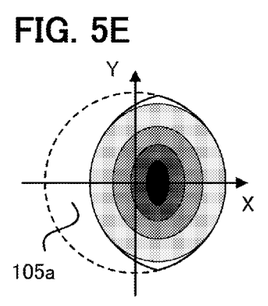
Figure 5F:
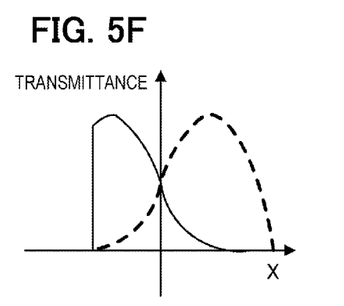

FIG. 5D represents the pupil transmittance distribution on the exit pupil 105 corresponding to the photoelectric conversion unit 112 in the ranging pixels 110 of the image pickup device region 1032, and corresponds to the left eccentric pupil region (second pupil region). FIG. 5E represents the pupil transmittance distribution on the exit pupil 105 corresponding to the photoelectric conversion unit 111 in the ranging pixels 110 of the image pickup device region 1032, and corresponds to the right eccentric pupil region (first pupil region). FIG. 5F represents the transmittance distribution on the x axial plane. Generally speaking, so-called vignetting where the light flux becomes shaded at the lens frame due to demands for the miniaturization of the imaging lens occurs in the peripheral imaged height, and the light flux that has passed through the diaphragm is never entirely guided to the image pickup device. Since vignetting occurs from one side on the pupil, the variation in the transmission efficiency will differ according to the shape of the original transmittance distribution. As shown in FIG. 5D, when a region 105a where vignetting occurs coincides with a region in which the original transmittance is high, the amount of decrease in the transmission efficiency will be great. Meanwhile, as shown in FIG. 5E, when a region 105a where vignetting occurs coincides with a region in which the original transmittance is low, the amount of decrease in the transmission efficiency will be small. Thus, with the ranging pixels 110 of the image pickup device region 1032, the transmission efficiency of the left eccentric pupil region will be a value that is lower than the transmission efficiency of the right eccentric pupil region. In other words, the picture signal based on the light flux that has passed through the left eccentric pupil region will be smaller than the picture signal based on the light flux that has passed through the right eccentric pupil region.

Figure 5G:
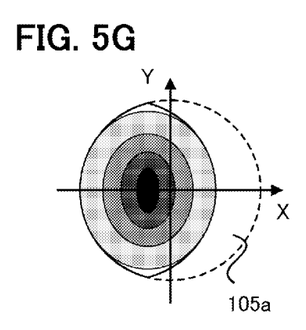
Figure 5H:
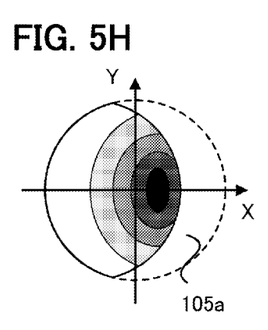
Figure 5I:
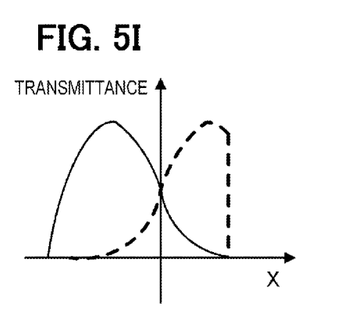

FIG. 5G represents the pupil transmittance distribution on the exit pupil 105 corresponding to the photoelectric conversion unit 112 in the ranging pixels 110 of the image pickup device region 1033, and corresponds to the left eccentric pupil region (second pupil region). FIG. 5H represents the pupil transmittance distribution on the exit pupil 105 corresponding to the photoelectric conversion unit 111 in the ranging pixels 110 of the image pickup device region 1033, and corresponds to the right eccentric pupil region (first pupil region). FIG. 5I represents the transmittance distribution on the x axial plane. Similarly, with the ranging pixels 110 of the image pickup device region 1033, the transmission efficiency of the right eccentric pupil region will be a value that is lower than the transmission efficiency of the left eccentric pupil region. Thus, the picture signal based on the light flux that has passed through the right eccentric pupil region will be smaller than the picture signal based on the light flux that has passed through the left eccentric pupil region.

Noise, particularly random noise, that is generated in the picture signal of the image pickup device is now explained. Dominant random noises are a photon shot noise Ns and a reading circuit noise Nr. The photon shot noise is generated during photoelectric conversion, and the level thereof depends on the size of the signal, and is the square root of the signal size (Ns=$S^{1/2}$). Meanwhile, the reading circuit noise is generated during the output from the reading unit, is not dependent on the size of the signal, is determined based on the manufacturing condition of the image pickup device, and takes on a constant value (Nr=const). Since the photon shot noise and the reading circuit noise are independent phenomena, the total value of noise will be the square root of the sum of squares. When the signal component in the picture signal is S and the reading circuit noise component is Nr, the SN ratio of the first signal is expressed as shown in Formula 1.

[Math. 1]

$$SN_1 = \frac{S_1}{\sqrt{S_1 + N_r^2}} \quad \text{Formula 1}$$

Similarly, the SN ratio of the second signal is expressed as shown in Formula 2.

[Math. 2]

$$SN_2 = \frac{S_2}{\sqrt{S_2 + N_r^2}} \quad \text{Formula 2}$$

The third signal is obtained by subtracting the first signal from the second signal. The signal component in the third signal will be the difference between the signal component in the second signal and the signal component in the first signal. Since the reading circuit noise is independently generated when the first signal is output and when the second signal is output, it becomes the square root of the sum of squares. Meanwhile, the photon shot noise component in the second signal is a result of the photon shot noise component of the signal charge transferred to the reading unit subsequently being added to the photon shot noise component in the first signal. Thus, the photon shot noise component in the third signal is the square root of the difference between the signal component in the second signal and the signal component in the first signal. Accordingly, the SN ratio of the third signal is expressed as shown in Formula 3.

[Math. 3]

$$SN_3 = \frac{S_2 - S_1}{\sqrt{S_2 - S_1 + 2N_r^2}} \quad \text{Formula 3}$$

Upon comparing Formula 1 and Formula 3, it can be seen that the photoelectric conversion unit that first transferred the signal charge to the reading unit can output signals with a more favorable SN ratio in comparison to the photoelectric conversion unit that transferred the signal charge subsequently. When the level of the signal component is great, since the photon shot noise is more dominant than the reading circuit noise (S>>$Nr^2$), the difference in the SN ratio between the first signal and the third signal is small. Nevertheless, when the object is dark and the signal component is great, the influence of the reading circuit noise increases relatively (S~$Nr^2$), and deterioration in the signal quality is considerable. When the SN ratio of the image signal used in ranging deteriorates, the reading error of the image deviation increases, and the ranging accuracy deteriorates.

In this embodiment, the signal charge of the photoelectric conversion unit with a smaller signal component of the picture is constantly transferred first to the reading unit. In other words, with the image pickup device region 1032 with a low transmission efficiency corresponding to the left eccentric pupil region (second pupil region), the signal charge of the photoelectric conversion unit 112 for receiving the light flux that has passed through the left eccentric pupil region is first transferred to the reading unit 119 then output. Meanwhile, with the image pickup device region 1033 with a low transmission efficiency corresponding to the right eccentric pupil region (first pupil region), the signal charge of the photoelectric conversion unit 111 for receiving the light flux that has passed through the right eccentric pupil region is first transferred to the reading unit 119 then output.

According to the foregoing configuration, by constantly selecting the photoelectric conversion unit with a smaller signal component of the picture signal and transferring this first to the reading unit, a picture signal with a high SN ratio can be acquired, and the distance can be measured accurately. In particular, the distance to a dark object can be measured accurately.

Since the second signal corresponds to the sum of the signal charges accumulated in the two photoelectric conversion units 111, 112, it becomes the picture signal based on the light flux that has passed through the entire range of the exit pupil 105 of the taking lens 101. Thus, the object image can be acquired based on the second signal. In comparison to the case of individually transferring the signal charges accumulated in the two photoelectric conversion units 111, 112 to the reading unit and outputting the signal charges and thereafter adding the two signals to generate a picture signal, since the method of using the second signal enables reduction in the reading circuit noise, a high quality object image can be acquired.

The positions of the first image pickup device region 1033 and the second image pickup device region 1032 in the image pickup device 103 are determined based on the level of transmission efficiency corresponding to the photoelectric conversion units 111, 112 in the ranging pixels 110. In other words, from which photoelectric conversion unit 111, 112 in the ranging pixels 110 the signal charge should be read is determined based on the level of transmission efficiency corresponding to the respective photoelectric conversion unit 111, 112. The transmission efficiency of the respective photoelectric conversion units is determined based on the arrangement of the exit pupil of the taking lens and the microlens and the photoelectric conversion unit of the ranging pixels, original transmission distribution that is determined based on the focus distance and imaging performance of the microlens, the aperture diameter (pupil diameter) of the taking lens, and vignetting. From which region in the image pickup device 103 the signal charge shall be read first from the photoelectric conversion unit 111 is determined based on the foregoing design value relating to the taking lens and the image pickup device.

Moreover, in an image pickup device region in which the difference in the transmission efficiency of both photoelectric conversion units is a predetermined threshold or less, since the difference in the picture signal quality is small, the photoelectric conversion unit to first transfer the signal charge to the signal charge may be determined based on a factor that is different from the transmission efficiency such as the ease of circuit formation or control signal generation in the image pickup device. In particular, from which photoelectric conversion unit the signal charge should be read first may be determined only with regard to the peripheral portion of the image pickup device in the which the difference in the transmission efficiency is great.

Note that, in this embodiment, while a configuration of juxtaposing the photoelectric conversion units in the x direction as the ranging pixels was shown, the present invention is not limited thereto. Even in the case of adopting the configuration of juxtaposing the photoelectric conversion units in the y direction and acquiring the parallax image of the y direction, the configuration may be such that the signal charge of the photoelectric conversion unit with a lower transmission efficiency corresponding to the respective photoelectric conversion units is first transferred to the reading unit. Moreover, even in the case of adopting the configuration of disposing the photoelectric conversion units in the xy direction and acquiring the parallax image of the xy direction, the configuration may be such that the signal charge of the photoelectric conversion unit with a lower transmission efficiency corresponding to the respective photoelectric conversion units is first transferred to the reading unit.

Moreover, while a microlens was used as the light guiding means for guiding, to the photoelectric conversion unit, the light flux that has passed through a partial region on the exit pupil of the taking lens, the configuration is not limited thereto. Any means such as a waveguide or a prism capable of controlling the propagation of light may be used. In particular, when a waveguide is used, light guiding can be efficiently performed even in the case when the pixel size of the image pickup device is small.

Embodiment 2

With the digital camera 100 in this embodiment, the photoelectric conversion unit that first transfers the signal charge to the reading unit is changed according to the photographing conditions. Since the configuration of the digital camera 100 in this embodiment is the same as Embodiment 1, the explanation thereof is omitted. In the ensuing explanation, the signal reading control is mainly explained in detail.

Figure 6:
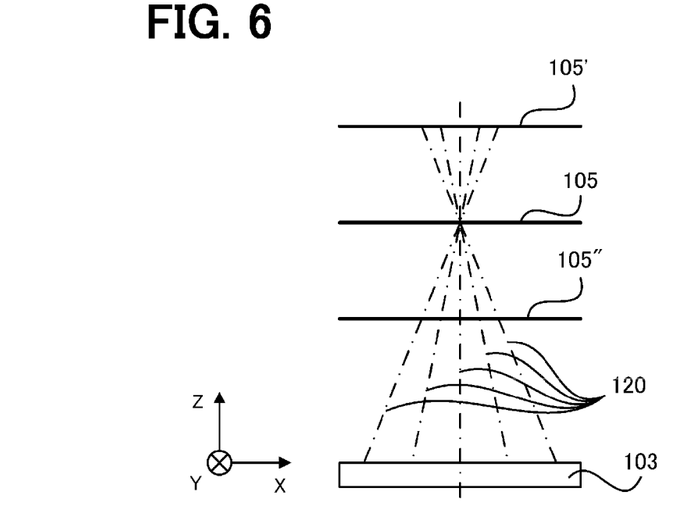
FIG. 6 is a diagram explaining that the exit pupil position will change based on a zoom.

Even when there is no vignetting of the taking lens, when the taking lens is a zoom lens, the transmission efficiency will change since the position of the exit pupil in the optical axis direction will change. In the initial condition, as shown in FIG. 3, the optical axes 120 of the respective ranging pixels 110 in the image pickup device 103 all pass through the center point of the exit pupil 105. Nevertheless, when the zoom position changes, the position of the exit pupil in the optical axis direction also changes. When the position of the exit pupil 105' differs from the exit pupil 105 in the initial condition, as shown in FIG. 6, the optical axes 120 of the ranging pixels 110 disposes in the periphery of the image pickup device 103 do not pass through the center point of the exit pupil 105'. Thus, the pupil region corresponding to the photoelectric conversion units 111, 112 in the ranging pixels 110 becomes decentered relative to the center point of the exit pupil 105', and the transmission efficiency thereby changes.

Figure 7:
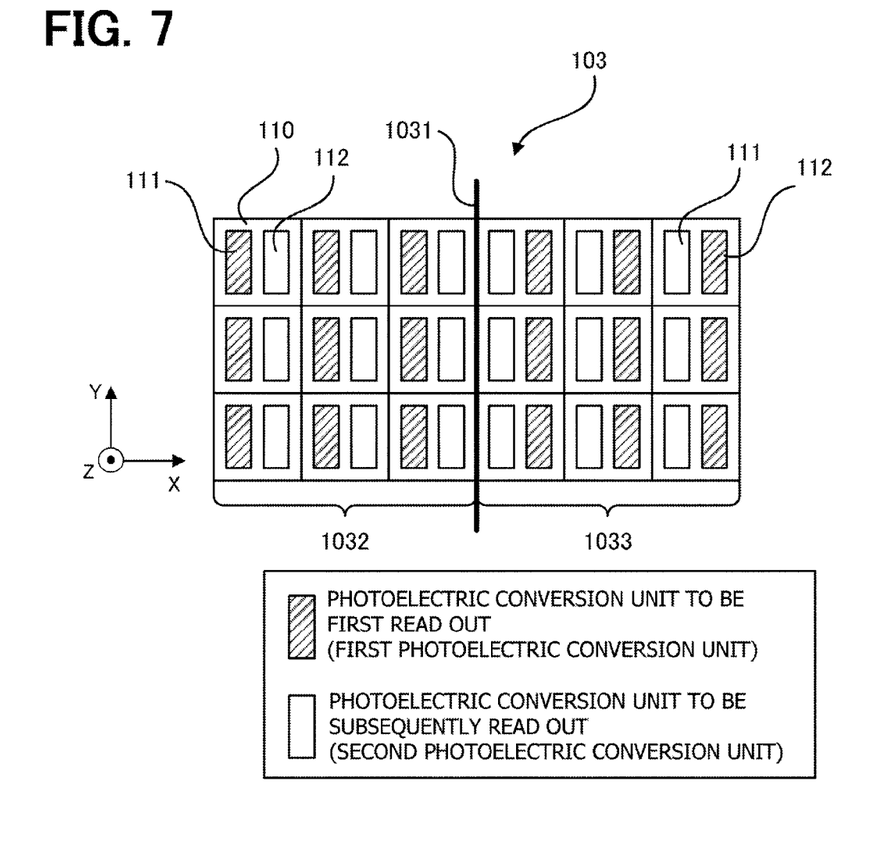
FIG. 7 is a top view of the relevant part of the image pickup device in Embodiment 2.
Figure 8A:
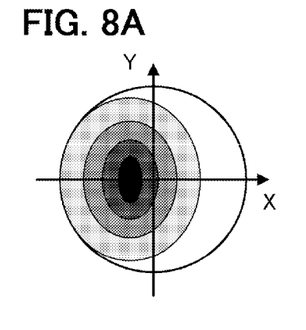
FIGS. 8A to 8I are diagrams explaining the reason why signals of a high SN ratio can be obtained in Embodiment 2.
Figure 8B:
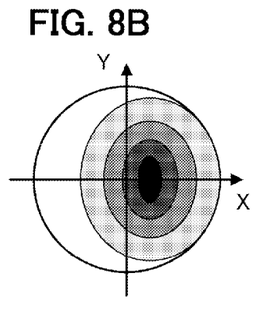
Figure 8C:
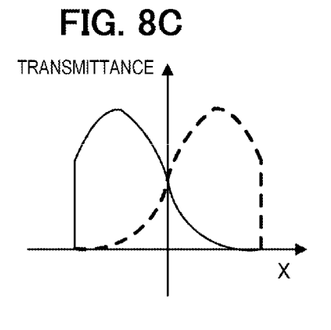

A case where the position of the exit pupil 105' differs from the exit pupil 105 in the initial condition and is far from the image pickup device 103 and near the object is now explained in detail with reference to FIG. 7 and FIG. 8. FIG. 7 is a top view of the relevant part of the image pickup device 103, and the shaded photoelectric conversion unit is the photoelectric conversion unit (first photoelectric conversion unit) in which the signal is first read in the foregoing condition. FIG. 8A represents the pupil transmittance distribution on the exit pupil 105' corresponding to the photoelectric conversion unit 112 in the ranging pixels 110 disposed near the center of the image pickup device 103, and corresponds to the left eccentric pupil region (second pupil region). The darker the color, the higher the transmittance, and lighter the color, the lower the transmittance. Similarly, FIG. 8B represents the pupil transmittance distribution on the exit pupil 105' corresponding to the photoelectric conversion unit 111 in the ranging pixels 110 disposed near the center of the image pickup device 103, and corresponds to the right eccentric pupil region (first pupil region). FIG. 8C represents the transmittance distribution on the x axial plane, and the horizontal axis shows the x axial coordinates and the vertical axis shows the transmittance. The solid line shows the transmittance distribution corresponding to the photoelectric conversion unit 112 (corresponding to the right eccentric pupil region), and the dotted line shows the transmittance distribution corresponding to the photoelectric conversion unit 111 (corresponding to the left eccentric pupil region).

The transmission efficiency in the respective pupil regions from the time that the light flux from the object enters the imaging optical system until the light flux reaches the photoelectric conversion unit is a value obtained by integrating the transmittance distribution in the exit pupil 105' shown in FIGS. 8A and 8B. With the ranging pixels 110 disposed near the center of the image pickup device 103, the transmission efficiency of the right eccentric pupil region and the transmission efficiency of the left eccentric pupil region are substantially the same. Thus, the size of the object picture signals based on the light flux that passes through the respective pupil regions is substantially the same. Accordingly, the signal charge of either photoelectric conversion unit may be first transferred to the reading unit.

Figure 8D:
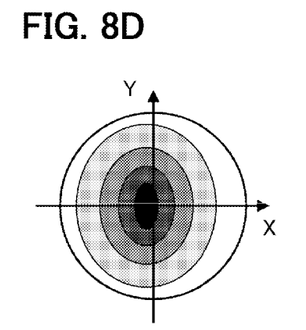
Figure 8E:
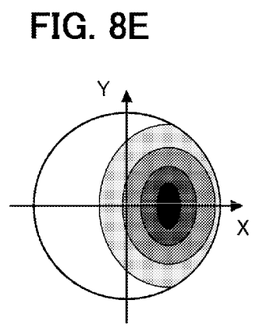
Figure 8F:
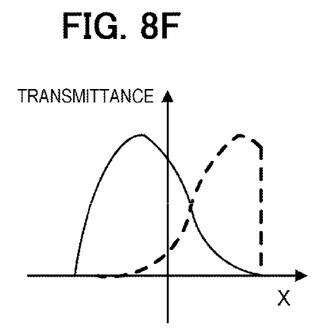

FIG. 8D represents the pupil transmittance distribution on the exit pupil 105' corresponding to the photoelectric conversion unit 112 in the ranging pixels 110 of the image pickup device region 1032 shown in FIG. 7, and corresponds to the left eccentric pupil region (second pupil region). FIG. 8E represents the pupil transmittance distribution on the exit pupil 105' corresponding to the photoelectric conversion unit 111 in the ranging pixels 110 of the image pickup device region 1032 shown in FIG. 7, and corresponds to the right eccentric pupil region (first pupil region). FIG. 8F represents the transmittance distribution on the x axial plane. Since the original transmittance distribution is decentered relative to the exit pupil, the transmission efficiency is different. As shown in FIG. 8D, when the eccentricity of the region with high transmittance relative to the center point of the pupil is small, the amount of decrease in the transmission efficiency is small. Meanwhile, as shown in FIG. 8E, when the eccentricity of the region with high transmittance relative to the center point of the pupil is great, the amount of decrease in the transmission efficiency is great. Thus, with the ranging pixels 110 of the image pickup device region 1032, the transmission efficiency of the right eccentric pupil region will be a value that is lower than the transmission efficiency of the left eccentric pupil region. In other words, the picture signal based on the light flux that has passed through the right eccentric pupil region will be smaller than the picture signal based on the light flux that has passed through the left eccentric pupil region. Thus, in the image pickup device region 1032, the signal charge of the photoelectric conversion unit 111 is transferred to the reading unit before than that of the photoelectric conversion unit 112.

Figure 8G:
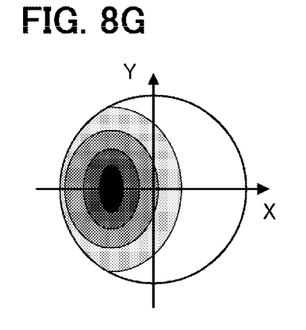
Figure 8H:
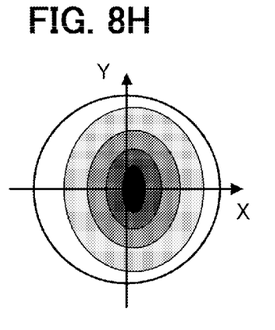
Figure 8I:
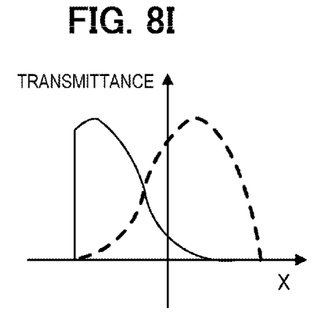

FIG. 8G represents the pupil transmittance distribution on the exit pupil 105' corresponding to the photoelectric conversion unit 112 in the ranging pixels 110 of the image pickup device region 1033 shown in FIG. 7, and corresponds to the left eccentric pupil region (second pupil region). FIG. 8H represents the pupil transmittance distribution on the exit pupil 105' corresponding to the photoelectric conversion unit 111 in the ranging pixels 110 of the image pickup device region 1033, and corresponds to the right eccentric pupil region (first pupil region). FIG. 8I represents the transmittance distribution on the x axial plane. Similarly, with the ranging pixels 110 of the image pickup device region 1033, the transmission efficiency of the left eccentric pupil region will be a value that is lower than the transmission efficiency of the right eccentric pupil region. Thus, the picture signal based on the light flux that has passed through the left eccentric pupil region will be smaller than the picture signal based on the light flux that has passed through the right eccentric pupil region. Thus, in the image pickup device region 1033, the signal charge of the photoelectric conversion unit 112 is transferred to the reading unit before than that of the photoelectric conversion unit 111.

Meanwhile, when the position of the exit pupil 105" differs from the exit pupil 105 in the initial condition and is near the image pickup device 103, the pupil region corresponding to the photoelectric conversion units 111, 112 in the ranging pixels 110 will be decentered to the opposite side relative to the center point of the exit pupil 105" (FIG. 6). In the foregoing case, contrarily, with the ranging pixels 110 of the image pickup device region 1032, the transmission efficiency of the left eccentric pupil region will be a value that is lower than the transmission efficiency of the right eccentric pupil region. In other words, the picture signal based on the light flux that has passed through the left eccentric pupil region will be smaller than the picture signal based on the light flux that has passed through the right eccentric pupil region. Moreover, with the ranging pixels 110 of the image pickup device region 1033, the transmission efficiency of the right eccentric pupil region will be a value that is lower than the transmission efficiency of the left eccentric pupil region. Thus, the picture signal based on the light flux that has passed through the right eccentric pupil region will be smaller than the picture signal based on the light flux that has passed through the left eccentric pupil region.

When the position of the exit pupil of the taking lens changes according to the zoom position as described above, the signal charge accumulated in the photoelectric conversion unit with a lower transmission efficiency is first transferred to the reading unit according to the positional relationship thereof. When the exit pupil position is closer to the image pickup device side than the initial condition (105" of FIG. 6), the signal charge of the photoelectric conversion unit 112 is first transferred to the reading unit with the ranging pixels 110 in the image pickup device region 1032. Moreover, the signal charge of the photoelectric conversion unit 111 is first transferred to the reading unit with the ranging pixels 110 in the image pickup device region 1033. Meanwhile, when the exit pupil position is closer to the object side than the initial condition (105' of FIG. 6), the signal charge of the photoelectric conversion unit 111 is first transferred to the reading unit with the ranging pixels 110 in the image pickup device region 1032. Moreover, the signal charge of the photoelectric conversion unit 112 is first transferred to the reading unit with the ranging pixels 110 in the image pickup device region 1033.

As described above, the transmission efficiency is determined based on the light guiding performance of the light guiding means of the ranging pixels and the pupil position, the pupil diameter, and the vignetting of the imaging optical system. Since the light guiding means of the ranging pixels is fixed, the level of transmission efficiency is obtained based on at least one information among the pupil position, the pupil diameter, and the vignetting of the imaging optical system, and the photoelectric conversion unit to first transfer the signal charge to the reading unit is thereby determined. The photoelectric conversion unit to first transfer the signal charge to the reading unit may also be determined based on the design value, or measured and determined at the stage of manufacturing the apparatus. Moreover, prior to performing the ranging, it is also possible to tentatively acquire the signal charge (first signal and third signal) of the photoelectric conversion units 111 and 112, compare the signal intensities thereof, and first read the signal charge from the photoelectric conversion unit with a weaker signal intensity. It is thereby possible to accurately perform ranging even when there is a change in the transmission efficiency caused by production variation, or environmental change caused by aging or temperature. Note that, upon tentative reading, it is also possible to read the signals corresponding to the individual signal charges from the respective photoelectric conversion unit without obtaining, based on the difference, the signal (third signal) corresponding to the signal charge of the photoelectric conversion unit to be read subsequently.

It is preferable to adopt a device configuration in which the photoelectric conversion unit to first transfer the signal charge to the reading unit is selectable in all ranging pixels, and select the photoelectric conversion unit based on the foregoing determination method, and thereby perform the signal charge transfer control. The control of the signal charge transfer order is performed by a control means (not shown) sending a transfer trigger signal to the signal line connected to the gate electrode of the photoelectric conversion unit in the respective ranging pixels.

As described above, the photoelectric conversion unit with a lower transmission efficiency is selected and the signal charge is first transferred to the reading unit according to the photographing conditions. Thus, by constantly selecting the photoelectric conversion unit with a smaller signal component of the picture signal and transferring this first to the reading unit, a picture signal with a high SN ratio can be acquired, and the distance can be measured accurately. In particular, the distance to a dark object can be measured accurately.

Figure 9:
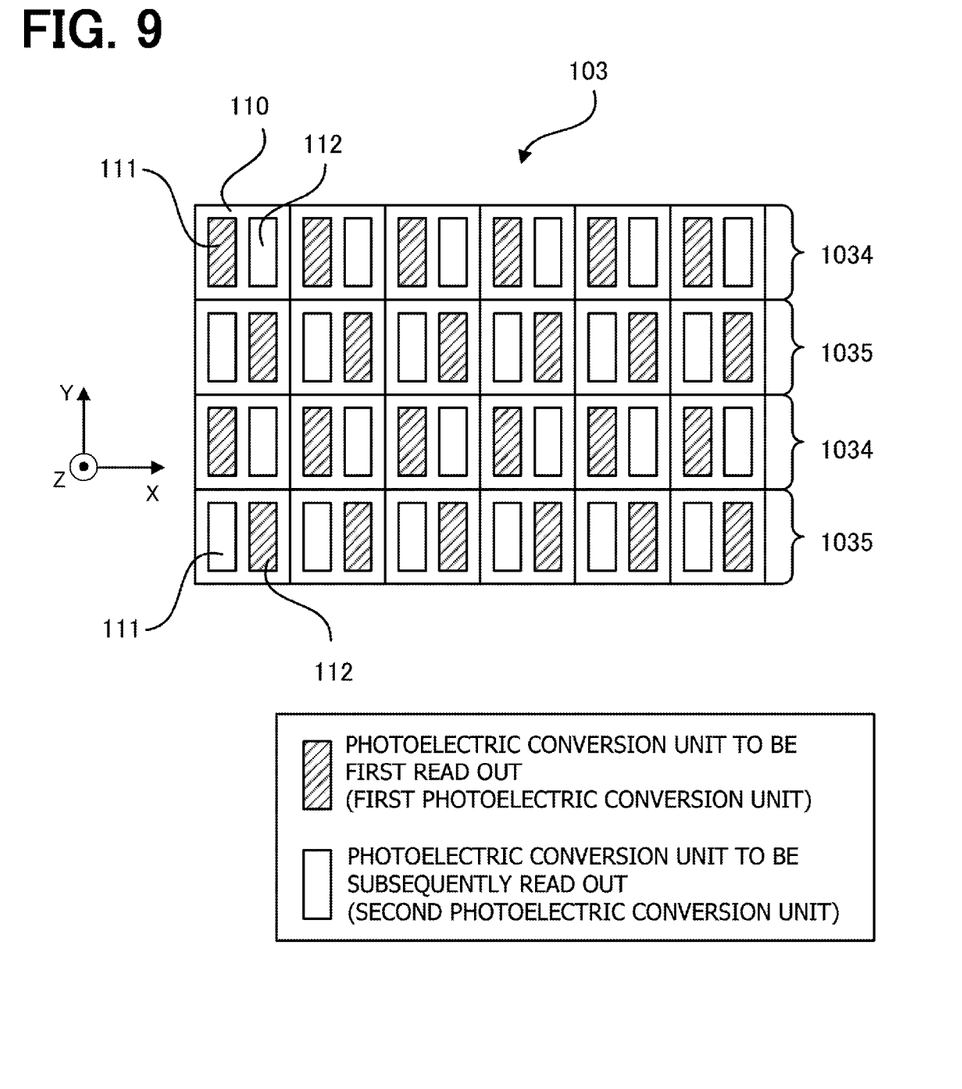
FIG. 9 is a top view of the relevant part of the image pickup device according to a modified example.

Moreover, as shown in FIG. 9, the first image pickup device region 1034 and the second image pickup device region 1035 may also be alternately disposed adjacent to each other for every line. With the ranging pixels of the first image pickup device region 1034, the signal line for transmitting the first transfer trigger signal is connected to the gate electrode of the photoelectric conversion unit 111 for receiving the light flux that has passed through the right eccentric pupil region (first pupil region). Moreover, the signal line for transmitting the second transfer trigger signal is connected to the gate electrode of the photoelectric conversion unit 112 for receiving the light flux that has passed through the left eccentric pupil region (second pupil region). Meanwhile, with the ranging pixels of the second image pickup device region 1035, the signal line for transmitting the first transfer trigger signal is connected to the gate electrode of the photoelectric conversion unit 112 for receiving the light flux that has passed through the left eccentric pupil region (second pupil region).

Moreover, the signal line for transmitting the second transfer trigger signal is connected to the gate electrode of the photoelectric conversion unit 112 for receiving the light flux that has passed through the right eccentric pupil region (first pupil region).

The control unit 104 inputs the first transfer trigger signal to the signal line and acquires the first signal from the reading unit 119, and thereafter inputs the second transfer trigger signal to the signal line to obtain the second signal. The control unit 104 obtains the third signal based on the signal difference between the first and second image signals. Subsequently, the control unit 104 extracts the first and third signals of the line in which the signal charge of the selected photoelectric conversion unit was first transferred to the reading unit from the output image signal, reconfigures the image signal, and thereby measures the distance. Consequently, since a complicated trigger signal does not need to be generated, the time lag until the start of photography can be shortened, and high-speed photograph is thereby enabled. Note that the first image pickup device region 1034 and the second image pickup device region 1035 do not need to be disposed for every line, and may be disposed near each other. The first image pickup device region 1034 and the second image pickup device region 1035 may be disposed every few lines in consideration of the arrangement of the color filter or the line interval during the thinning output, or arranged in the column direction or diagonal direction.

Note that the ranging pixels may be disposed on the entire surface of the image pickup device, or disposed on a partial region. Moreover, the position of the focusing lens may be controlled for performing auto-focus operations or the image may be processed such as by adding a blur according to the distance from the focusing plane based on the distance information acquired with the depth measurement apparatus of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-121177, filed on Jun. 7, 2013, which is hereby incorporated by reference herein in its entirety.

What is claimed is:

1. A depth measurement apparatus, comprising:
    an imaging optical system;
    an image pickup device which includes pixels each having a photoelectric conversion unit for receiving a light flux that has passed through a first pupil region of the imaging optical system and a photoelectric conversion unit for receiving a light flux that has passed through a second pupil region, that is different from the first pupil region, of the imaging optical system;
    a reading unit that is shared by a plurality of photoelectric conversion units in the pixels; and
    a control unit configured to control a ranging operation, wherein the control unit is configured such that:
        a signal charge accumulated in a first photoelectric conversion unit among the plurality of photoelectric conversion units is transferred to the reading unit, and a first signal corresponding to the signal charge accumulated in the first photoelectric conversion unit is output,
        a signal charge accumulated in a second photoelectric conversion unit among the plurality of photoelectric conversion units that is different from the first photoelectric conversion unit is transferred to the reading unit, and a second signal corresponding to a sum of the signal charges accumulated in the first and second photoelectric conversion units is output,
        a third signal corresponding to the signal charge accumulated in the second photoelectric conversion unit is obtained based on a difference between the second signal and the first signal,
        a distance to an object is measured based on an image shift amount of parallax images respectively obtained from the first signal and the third signal, and
        the first photoelectric conversion unit is, out of the photoelectric conversion units of a pixel including the photoelectric conversion unit for receiving the light flux that has passed through the first pupil region and the photoelectric conversion unit for receiving the light flux that has passed through the second pupil region, the photoelectric conversion unit which receives light flux with a relatively lower transmittance in a travel path from an object to the pixel.

2. The depth measurement apparatus according to claim 1, wherein the first photoelectric conversion unit is determined by using at least one information among a pupil position, a pupil diameter, and vignetting of the imaging optical system upon measuring the distance.

3. The depth measurement apparatus according to claim 1, wherein tentative signals corresponding to the signal charge accumulated in the respective photoelectric conversion units of the pixels are acquired, signal intensities of the acquired signals are compared, and the first photoelectric conversion unit is thereby determined.

4. The depth measurement apparatus according to claim 1, wherein
    the reading unit is adapted to select a reading order of the plurality of photoelectric conversion units, and first reads the signal charge of the photoelectric conversion unit that has been determined as the first photoelectric conversion unit.

5. The depth measurement apparatus according to claim 1, wherein
    the image pickup device is configured by the pixels being arranged two-dimensionally, and includes a first image pickup device region in which the signal charge of the photoelectric conversion unit for receiving the light flux that has passed through the first pupil region is first read in the pixels, and a second image pickup device region in which the signal charge of the photoelectric conversion unit for receiving the light flux that has passed through the second pupil region is first read in the pixels, and
    when a direction in which a straight line passing through a center of gravity of the first pupil region and a center of gravity of the second pupil region extends is a first direction, a line segment that passes through a center of the image pickup device and is perpendicular to a direction on the image pickup device corresponding to the first direction is used as a boundary line, and the first image pickup device region and the second image pickup device region are arranged across the boundary line.

6. The depth measurement apparatus according to claim 1, wherein
    the image pickup device includes pixels for first reading the signal charge of the photoelectric conversion unit for receiving the light flux that has passed through the first pupil region, and pixels for first reading the signal charge of the photoelectric conversion unit for receiving the light flux that has passed through the second pupil region, and a distance to the object is measured using an output from the pixels for first reading the signal charge of the photoelectric conversion unit receiving light flux with a lower transmittance.

7. The depth measurement apparatus according to claim 6, wherein
the image pickup device is configured by the pixels being arranged two-dimensionally, and
a first image pickup device region in which are arranged the pixels for first reading the signal charge of the photoelectric conversion unit for receiving the light flux that has passed through the first pupil region, and a second image pickup device region in which are arranged the pixels for first reading the signal charge of the photoelectric conversion unit for receiving the light flux that has passed through the second pupil region are arranged adjacent to each other.

8. An imaging apparatus comprising the depth measurement apparatus according to claim 1,
the imaging apparatus acquiring an object image based on the second signal.

9. A method of controlling a depth measurement apparatus that includes:
an imaging optical system;
an image pickup device which includes pixels each having a photoelectric conversion unit for receiving a light flux that has passed through a first pupil region of the imaging optical system and a photoelectric conversion unit for receiving a light flux that has passed through a second pupil region, that is different from the first pupil region, of the imaging optical system; and
a reading unit that is shared by a plurality of photoelectric conversion units in the pixels,
the method comprising the steps of:
determining, as the first photoelectric conversion unit, out of the photoelectric conversion units of a pixel including the photoelectric conversion unit for receiving the light flux that has passed through the first pupil region and the photoelectric conversion unit for receiving the light flux that has passed through the second pupil region, the photoelectric conversion unit which receives light flux with a relatively higher transmittance in a travel path from an object to the pixel;
transferring a signal charge accumulated in a first photoelectric conversion unit among the plurality of photoelectric conversion units to the reading unit, and outputting a first signal corresponding to the signal charge accumulated in the first photoelectric conversion unit;
transferring a signal charge accumulated in a second photoelectric conversion unit among the plurality of photoelectric conversion units that is different from the first photoelectric conversion unit to the reading unit, and outputting a second signal corresponding to a sum of the signal charges accumulated in the first and second photoelectric conversion units;
obtaining a third signal corresponding to the signal charge accumulated in the second photoelectric conversion unit based on a difference between the second signal and the first signal; and
measuring a distance to an object based on an image shift amount of parallax images respectively obtained from the first signal and the third signal.

10. The method of controlling a depth measurement apparatus according to claim 9, wherein in the determining step, the first photoelectric conversion unit is determined by using at least one information among a pupil position, a pupil diameter, and vignetting of the imaging optical system upon measuring the distance.

11. The method of controlling a depth measurement apparatus according to claim 9, wherein in the determining step, tentative signals corresponding to the signal charge accumulated in the respective photoelectric conversion units of the pixels are acquired, signal intensities of the acquired signals are compared, and the first photoelectric conversion unit is thereby determined.

12. An imaging apparatus, comprising:
an imaging optical system;
an image pickup device which includes pixels each having a photoelectric conversion unit for receiving a light flux that has passed through a first pupil region of the imaging optical system and a photoelectric conversion unit for receiving a light flux that has passed through a second pupil region, that is different from the first pupil region, of the imaging optical system;
a reading unit that is shared by a plurality of photoelectric conversion units in the pixels; and
a control unit configured to control generating image signals for obtaining defocus amount,
wherein the control unit is configured such that:
a signal charge accumulated in a first photoelectric conversion unit among the plurality of photoelectric conversion units is transferred to the reading unit, and a first signal corresponding to the signal charge accumulated in the first photoelectric conversion unit is output,
a signal charge accumulated in a second photoelectric conversion unit among the plurality of photoelectric conversion units that is different from the first photoelectric conversion unit is transferred to the reading unit, and a second signal corresponding to a sum of the signal charges accumulated in the first and second photoelectric conversion units is output,
a third signal corresponding to the signal charge accumulated in the second photoelectric conversion unit is obtained based on a difference between the second signal and the first signal,
the defocus amount is obtained from the first signal and the third signal, and
the first photoelectric conversion unit is, out of the photoelectric conversion units of a pixel including the photoelectric conversion unit for receiving the light flux that has passed through the first pupil region and the photoelectric conversion unit for receiving the light flux that has passed through the second pupil region, the photoelectric conversion unit which receives light flux with a relatively lower transmittance in a travel path from an object to the pixel.

13. A method of controlling an imaging apparatus that includes:
an imaging optical system;
an image pickup device which includes pixels each having a photoelectric conversion unit for receiving a light flux that has passed through a first pupil region of the imaging optical system and a photoelectric conversion unit for receiving a light flux that has passed through a second pupil region, that is different from the first pupil region, of the imaging optical system; and
a reading unit that is shared by a plurality of photoelectric conversion units in the pixels,
the method comprising the steps of:
determining, as the first photoelectric conversion unit, out of the photoelectric conversion units of a pixel including the photoelectric conversion unit for receiving the light flux that has passed through the first pupil region and the photoelectric conversion unit for receiving the light flux that has passed through the second pupil region, the photoelectric conversion unit which receives light flux with a relatively higher transmittance in a travel path from an object to the pixel;

transferring a signal charge accumulated in a first photoelectric conversion unit among the plurality of photoelectric conversion units to the reading unit, and outputting a first signal corresponding to the signal charge accumulated in the first photoelectric conversion unit;

transferring a signal charge accumulated in a second photoelectric conversion unit among the plurality of photoelectric conversion units that is different from the first photoelectric conversion unit to the reading unit, and outputting a second signal corresponding to a sum of the signal charges accumulated in the first and second photoelectric conversion units;

obtaining a third signal corresponding to the signal charge accumulated in the second photoelectric conversion unit based on a difference between the second signal and the first signal; and obtaining a defocus amount from the first signal and the third signal.

* * * * *